United States Patent
Shen

(10) Patent No.: US 10,757,839 B2
(45) Date of Patent: Aug. 25, 2020

(54) COOLING SYSTEM AND DEVICE FOR SERVER

(71) Applicant: Dawning Information Industry (Beijing) Co., Ltd, Beijing (CN)

(72) Inventor: Weidong Shen, Beijing (CN)

(73) Assignee: DAWNING INFORMATION INDUSTRY (BEIJING) CO., LTD., Beijing (CN)

( * ) Notice: Subject to any disclaimer, the term of this patent is extended or adjusted under 35 U.S.C. 154(b) by 176 days.

(21) Appl. No.: 15/771,643

(22) PCT Filed: Oct. 28, 2015

(86) PCT No.: PCT/CN2015/093102
§ 371 (c)(1),
(2) Date: Apr. 27, 2018

(87) PCT Pub. No.: WO2017/070867
PCT Pub. Date: May 4, 2017

(65) Prior Publication Data
US 2018/0303008 A1    Oct. 18, 2018

(51) Int. Cl.
*H05K 7/20* (2006.01)
*G06F 1/20* (2006.01)

(52) U.S. Cl.
CPC ........... *H05K 7/20818* (2013.01); *G06F 1/20* (2013.01); *H05K 7/203* (2013.01); *H05K 7/20318* (2013.01); *G06F 2200/201* (2013.01)

(58) Field of Classification Search
CPC ............... H05K 7/20818; H05K 7/203; H05K 7/20381; G06F 2200/201; G06F 1/20

USPC ......................................................... 62/259.2
See application file for complete search history.

(56) References Cited

U.S. PATENT DOCUMENTS

| 5,297,621 | A  | * | 3/1994  | Taraci .............. | G01R 31/2891 |
|-----------|-----|---|---------|-----------|--------------|
|           |     |   |         |           | 165/104.13   |
| 9,144,179 | B2 | * | 9/2015  | Shelnutt ............. | H05K 7/203 |
| 9,250,024 | B2 | * | 2/2016  | Campbell ............ | F28F 3/048 |
| 9,258,926 | B2 | * | 2/2016  | Smith ............... | H05K 7/20818 |
| 9,261,308 | B2 | * | 2/2016  | Campbell ............ | F28F 3/048 |
| 2010/0328890 | A1 | * | 12/2010 | Campbell ............ | F28F 3/022 |
|           |     |   |         |           | 361/700      |

FOREIGN PATENT DOCUMENTS

| CN | 104991623 | 10/2015 |
| JP | S 59216219 | 12/1984 |

OTHER PUBLICATIONS

International Search Report dated Aug. 1, 2016 from corresponding application No. PCT/CN2015/093102.

\* cited by examiner

*Primary Examiner* — Ana M Vazquez
(74) *Attorney, Agent, or Firm* — Hauptman Ham, LLP

(57) ABSTRACT

A server cooling system includes a shell accommodated with a cooling liquid, a condensation module, a mechanical arm, a buffer bin and a control module. The server cooling system automatically takes out and places in a heating element, and avoids the gasified cooling liquid steam from leaking, improving the safety factor during operation, and reducing loss of the cooling liquid.

15 Claims, 1 Drawing Sheet

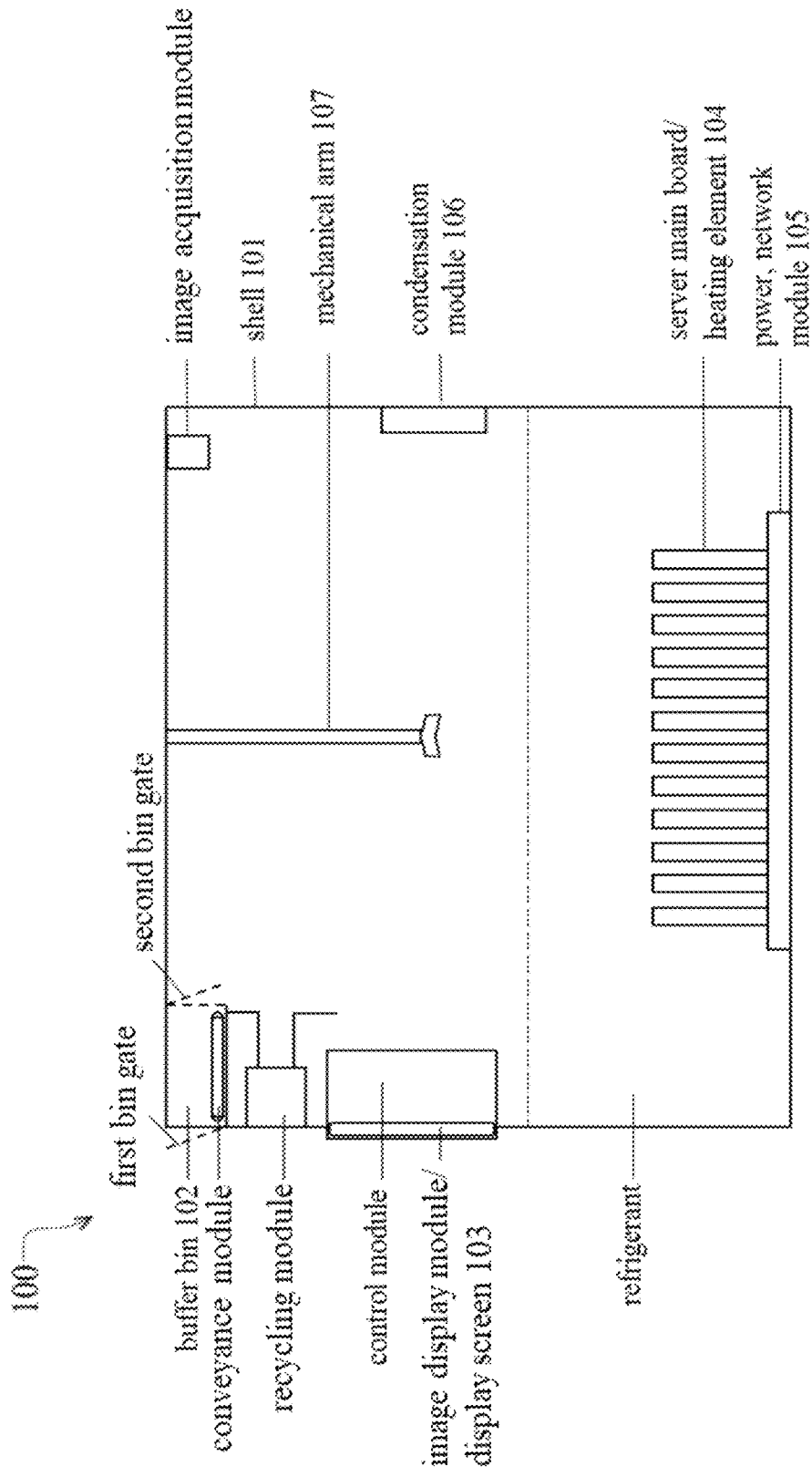

COOLING SYSTEM AND DEVICE FOR SERVER

FIELD OF THE INVENTION

The present invention relates to the field of servers, in particular to a server cooling system and device.

BACKGROUND OF THE INVENTION

In the current server field, a heating element is generally cooled by using an air cooling system. However, in a large scale data center, only an air cooling system is already far from satisfying the requirement of a high heat-flow density server for heat dissipation. In recent years, a water cooling system having a remarkable effect is developed; the water cooling system can lead a refrigerant directly to a heat source, instead of indirect refrigeration like the air cooling system. Compared to the air cooling system, the heat transferred per unit of volume, namely the heat dissipation efficiency, is as high as 3500 times. Therefore, the water cooling system is input to the market for use from the initial stage the system is developed. The server tycoons such as HP, IBM and the like, and other companies focusing on data center technology all launched water cooling heat dissipation products early or late.

At present, the liquid cooled servers on the market mostly adopt the refrigerant water. However, the water containing impurities is a good conductor, and is easy to cause a circuit board to be short. Although the existing water cooling radiator manufacturers ensure that the products thereof are completely sealed and free of leakage, the water containing impurities is still a hidden danger all the time, which makes most server manufacturers step back to the technology.

One alternative solution is to use an insulating refrigerant to cool the server. According to the principle of phase change heat exchange, the latent heat of vaporization is taken away from the heat when the refrigerant is boiling. The latent heat of vaporization when the refrigerant boils is utilized to transfer heat. Since the latent heat of vaporization of a liquid is many times greater than specific heat, the cooling effect of the phase change heat exchange is much better than a water cooled server. However, once the situation that the cooling device has a poor sealing effect occurs to the liquid cooled server, the refrigerant steam is very easy to leak and lose, thus causing loss to the refrigerant and reducing the cooling capability of the liquid cooling system. Moreover, once the server immersed in a cylinder fails and requires to be maintained, a maintainer must open an upper cover plate, and take out the server immersed in the refrigerant before starting maintenance. In such a process, the refrigerant groove is opened, thus the refrigerant directly contacts the air; the process not only causes the volatilization and waste of the refrigerant, but also improves the chemical reagent concentration in closed space. Even if the refrigerant is harmless to environment and human body, a user will also feel worried.

For the problems in the related art, no effective solution is proposed at present.

SUMMARY OF THE INVENTION

To solve the problems in the related art, the present invention provides a server cooling system and device, and can automatically take out and put in a heating element, avoids manual labor, and can prevent gasified cooling liquid steam from leaking. Furthermore, the present invention has a buffer bin structure, and can recycle refrigerant steam, thus improving the safety factor during operation, reducing the loss of the refrigerant, and saving cost.

The technical solution of the present invention is realized as follows:

According to one aspect of the present invention, a server cooling system is provided.

The system comprises:

a shell, accommodated therein with a cooling liquid;

a condensation module, located in the shell, and accommodated therein with a refrigerating material for cooling the gasified cooling liquid;

a mechanical arm, located in the shell, used for clamping a heating element immersed in the cooling liquid, and configured to move in three-dimensional space;

a buffer bin, located in the shell, disposed above the liquid level of the cooling liquid, and provided with a first bin gate and a second bin gate on the opposite sides thereof, wherein the first bin gate is located on the outer surface of the shell, and the second bin gate is located in the shell;

a conveyance module, configured in the buffer bin, and used for conveying the heating element in the buffer bin; and a control module, located outside the shell, electrically connected to the mechanical arm and the buffer bin, and used for controlling the buffer bin and the mechanical arm, wherein the control module comprises an image display module for displaying image information in the shell.

Preferably, the first bin gate and the second bin gate are not opened synchronously.

Preferably, the conveyance module is configured to convey the heating element in the buffer bin in two directions.

Preferably, the conveyance module comprises any one of the following:

a conveyor belt and a tray.

Preferably, the buffer bin further comprises:

a recycling module, for recycling the cooling liquid in the buffer bin.

Preferably, the control module is used for controlling the opening and closing of the first and second bin gates of the buffer bin; and the control module is further used for controlling the conveying direction of the conveyance module.

Preferably, the image display module is further used for providing a user with an operation interface.

Preferably, the cooling system further comprises: an image acquisition module, electrically connected to the control module, and used for acquiring image information in the shell.

According to another aspect of the present invention, a server cooling device is provided.

The device comprises:

a shell, accommodated therein with a cooling liquid;

a condensation module, located in the shell, and accommodated therein with a refrigerating material;

a mechanical arm, located in the shell, and configured to move in three-dimensional space;

a buffer bin, located in the shell, disposed above the liquid level of the cooling liquid, and provided with a first bin gate and a second bin gate on the opposite sides thereof, wherein the first bin gate is located on the outer surface of the shell; the second bin gate is located in the shell; and the buffer bin is provided therein with a conveyance module; and a control module, located outside the shell, and electrically connected to the mechanical arm and the buffer bin, wherein the control module comprises an image display module.

Preferably, the refrigerating material is used for cooling the cooling liquid having absorbed heat and been gasified.

Preferably, the first bin gate and the second bin gate are not opened synchronously.

Preferably, the conveyance module is configured to convey the heating element in the buffer bin in two directions.

Preferably, the conveyance module comprises any one of the following:

a conveyor belt and a tray.

Preferably, the buffer bin further comprises:

a recycling module, for recycling the cooling liquid in the buffer bin.

Preferably, the control module is used for controlling the opening and closing of the first and second bin gates of the buffer bin; and the control module is further used for controlling the conveying direction of the conveyance module.

Preferably, the device further comprises:

an image acquisition module, electrically connected to the control module, and used for acquiring image information in the shell.

Preferably, the image display module is used for displaying the image information.

BRIEF DESCRIPTION OF THE DRAWINGS

In order to more clearly describe the technical solution in the embodiments of the present invention or the technical solution in the prior art, the accompanying drawings to be used in the embodiments will be described simply hereinafter. Obviously, the drawings described hereinafter are merely some embodiments of the present invention. Those skilled in the art may obtain other drawings according to these drawings without any inventive efforts.

FIG. 1 is a schematic view of the server cooling system according to the embodiment of the present invention.

DETAILED DESCRIPTION OF THE PREFERRED EMBODIMENTS

Hereinafter, the technical solution in the embodiments of the present invention will be described clearly and completely with the accompanying figures. Obviously, the described embodiments are merely some embodiments of the present invention rather than all embodiments. Based on the embodiments in the present invention, all other embodiments obtained by those skilled in the art all belong to the protection scope of the present invention.

The object of the present invention is to provide a cooling system and device for cooling a server. In some embodiments, the disclosed cooling system comprises a sealed shell accommodated with a cooling liquid, a condensation module for cooling the gasified cooling liquid, and a mechanical arm for operating a heating element, and further comprises a buffer bin for recycling and isolating cooling liquid steam, and a control module for controlling the mechanical arm and the buffer bin.

FIG. 1 shows a preferred embodiment of the server cooling system 100. The cooling system 100 is an immersed cooling system; namely, the shell 101 of the cooling system 100 is accommodated therein with a cooling liquid; and the heating element 104 is immersed in the cooling liquid. In one preferred embodiment of the present invention, the heating element 104 can be plural, and the number thereof can be adjusted according to practical requirements and the internal space of the cooling system 100. The condensation module 106 is disposed above the liquid level of the cooling liquid, and is accommodated therein with a refrigerating material. Furthermore, the condensation module 106 can be located on the inner wall, or upper wall of the shell 101, or any other spatial positions without influencing the operation of the mechanical arm 107. In one embodiment, the condensation module 106 can be a condensing coil accommodated therein with cooling water.

Specifically, in one embodiment, the heating element 104 is, for example, a server main board; in the process the cooling system 100 of the present invention cools the server main board, a plurality of server main boards are immersed in the cooling liquid. After the server is activated, the CPU and other elements on the main board will emit heat; and the generated heat boils the cooling liquid to generate bubbles which become refrigerant steam. The steam rises and encounters the condensation module 106; since the condensation module 106 is accommodated therein with the refrigerating material, the condensation module can cool the gasified cooling liquid, such that the steam is condensed on the outer surface of the condensation module, and becomes liquid drops again. And the liquid drops drip back to the cooling liquid under the action of gravity, thus completing the recycling of the entire cooling system.

In one preferred embodiment of the present invention, the buffer bin 102 is disposed at the left upper corner in the shell 101; in other embodiments, the buffer bin 102 can be located at any position above the cooling liquid in the shell 101. In one embodiment, when the buffer bin 102 is disposed on the side wall of the shell 101, the buffer bin 101 is provided with two bin gates on the opposite sides thereof, wherein one bin gate is disposed in the shell 101, and the other bin gate is disposed on the outer surface of the shell 101. In other embodiments, the buffer bin 102 can be also disposed on the upper wall of the shell 101, and is still provided with two bin gates, wherein one bin gate is located on the outer surface of the shell 101, and the other bin gate is disposed on any one of the other three surfaces of the buffer bin 102. Particularly, the two bin gates of the buffer bin are not opened synchronously. In one embodiment, the buffer bin 102 is further provided therein with a conveyor (unshown), wherein the conveyor can comprise but not limited to: a conveyor belt and a tray. Furthermore, the conveyor has a bidirectional conveyance function. in one preferred embodiment of the present invention, the cooling system 100 is provided with a mechanical arm 107 which can be precisely positioned at any point in three-dimensional space to perform operation. The mechanical arm 107 can be used to clamp and operate the heating element immersed in the cooling liquid. In one embodiment, the mechanical arm 107 can insert the server main board into a power socket and a network module 105 to complete the connection between a server network and a power supply module. In another embodiment, the mechanical arm 107 can be further used to automatically take out the failed sever when the server fails.

In one embodiment, while the cooling system 100 operates the failed server, the mechanical arm 107 and the buffer bin 102 are both controlled by the control module (unshown). The control module is provided with a display screen 103 which can be disposed on the front panel of the shell 101; an operator can issues an operating instruction to the control module via the display screen 103, wherein the operating instruction comprises but not limited to: pulling out/inserting the server main board. In addition, the display screen 103 can be further used to display the image information in the shell 101 acquired by the image acquisition module (unshown). Specifically, in one preferred embodiment of the present invention, when the server fails and requires pulling out, the operator can select the information pertaining to the main board required to be pulled out and a corresponding operation via the display screen 103, wherein the information pertaining to the main board can be the position number of the main board, or other information by means of which the position of the failed main board can be determined. Subsequently, the control modules activates an automatic program, controls the mechanical arm 107 to position and pull out the failed server, and moves the failed server above the liquid level of the cooling liquid. In one preferred embodiment of the present invention, the mechanical arm 107 can further comprise a manipulator which can pull the main board in the server out of the server. Subsequently, the mechanical arm 107 drives the server to swing left and right in the horizontal direction, such that the residual cooling liquid on the main board can drip back to the cooling liquid, in which way the cooling liquid is recycled, thus avoiding the cooling liquid from wasting. Then, the mechanical arm 107 turns over the server main board, changes the main board from vertical direction to horizontal direction, and conveys the main board to the buffer bin 102.

Specifically, in one embodiment, when the mechanical arm 107 conveys the main board to the buffer bin 102, the control module controls the buffer bin 102 to open the right bin gate in the shell 101, wherein the right bin gate has a good sealing performance. After the mechanical arm 107 horizontally conveys the main board to the buffer bin 102, the right bin gate is closed. In an alternative embodiment of the present invention, the buffer bin can be further provided with a recycling device which can be a compressor and can be used to recycle the refrigerant steam or refrigerant liquid in the buffer bin 102. Subsequently, the left bin gate of the buffer bin 102 is opened; the conveyor is utilized to convey the server main board out; then the operator can pick up the main board for maintenance.

In one embodiment, while the cooling system 100 inserts the maintained server or a new server, the mechanical arm 107 and the buffer bin 102 are still both controlled by the control module. The operator can issue a server insertion instruction to the control module via the display screen 103. The control module controls the buffer bin 102 to open the left bin gate; if the conveyance module in the buffer bin is a tray, then the tray will be ejected out as the left bin gate is opened. The server main board is placed on the conveyance module, and is then conveyed to the buffer bin 102. The control module controls the buffer bin 102 to first close the left bin gate and then open the right bin gate, controls the mechanical arm 107 to convey the main board to a specified position, and inserts the main board into the network module and the power supply module, thus completing the installation process of the main board.

Therefore, the present application provides a server cooling system. The cooling system comprises: a shell accommodated therein with a cooling liquid; a condensation module, located in the shell, and accommodated therein with a refrigerating material for cooling the gasified cooling liquid; a mechanical arm, located in the shell, used for clamping a heating element immersed in the cooling liquid, and configured to move in three-dimensional space; a buffer bin, located in the shell, disposed above the liquid level of the cooling liquid, and provided with a first bin gate and a second bin gate on the opposite sides thereof, wherein the first bin gate is located on the outer surface of the shell, and the second bin gate is located in the shell; a conveyance module, configured in the buffer bin, and used for conveying the heating element in the buffer bin; and a control module, located outside the shell, electrically connected to the mechanical arm and the buffer bin, and used for controlling the buffer bin and the mechanical arm, wherein the control module comprises an image display module for displaying image information in the shell.

In another embodiment, the present application further provides a server cooling device. The cooling device comprises: a shell accommodated therein with a cooling liquid; a condensation module, located in the shell, and accommodated therein with a refrigerating material; a mechanical arm, located in the shell, and configured to move in three-dimensional space; a buffer bin, located in the shell, disposed above the liquid level of the cooling liquid, and provided with a first bin gate and a second bin gate on the opposite sides thereof, wherein the first bin gate is located on the outer surface of the shell, the second bin gate is located in the shell, and the buffer bin is provided therein with a conveyance module; and a control module, located outside the shell, and electrically connected to the mechanical arm and the buffer bin, wherein the control module comprises an image display module.

To sum up, the technical solution of the present invention can automatically take out and put in a heating element via the mechanical arm and the control module, thus avoiding manual labor. Moreover, the double-gate buffer bin disposed in the shell can effectively prevent the gasified cooling liquid steam from leaking, thus improving the safety factor during operation. Furthermore, the buffer bin can also recycle the cooling liquid and the cooling liquid steam, thus avoiding the cooling liquid from wasting, and reducing the loss of the cooling liquid. In addition, the display screen provided by the control module can provide a user with a friendly operation interface, thus enabling the operation process to become more flexible, efficient and convenient.

The foregoing is merely preferred embodiments of the present invention rather than limiting the present invention. Any modifications, equivalent replacements and improvements made within the spirit and principle of the present invention shall all be contained in the protection scope of the present invention.

What is claimed is:
1. A server cooling system, comprising:
a shell, accommodated therein with a cooling liquid;
a condensation module, located in the shell, and accommodated therein with a refrigerating material for cooling the gasified cooling liquid;
a mechanical arm, located in the shell, used for clamping a heating element immersed in the cooling liquid, and configured to move in three-dimensional space;
a buffer bin, located in the shell, disposed above a liquid level of the cooling liquid, and provided with a first bin gate and a second bin gate on the opposite sides of the buffer bin, wherein the first bin gate is located on an outer surface of the shell, and the second bin gate is located in the shell;
a conveyance module, configured in the buffer bin, and used for conveying the heating element in the buffer bin;
a control module, located outside the shell, electrically connected to the mechanical arm and the buffer bin, and used for controlling the buffer bin and the mechanical arm, wherein the control module comprises an image display module for displaying image information in the shell, the image display module is configured to a display screen, the control module is used for controlling the opening and closing of the first and second bin gates of the buffer bin, the control module is further used for controlling a conveying direction of the conveyance module.

2. The system according to claim 1, wherein:
the first bin gate and the second bin gate are not opened synchronously.

3. The system according to claim 1, wherein:
the conveyance module is configured to convey the heating element in the buffer bin in two directions.

4. The system according to claim 1, wherein the conveyance module comprises any one of the following:
a conveyor belt and a tray.

5. The system according to claim 1, wherein the buffer bin further comprises:
a recycling module, for recycling the cooling liquid in the buffer bin.

6. The system according to claim 1, wherein:
the image display module is further used for providing a user with an operation interface.

7. The system according to claim 1, comprising:
an image acquisition module, electrically connected to the control module, and used for acquiring image information in the shell.

8. A server cooling device, comprising:
a shell, accommodated therein with a cooling liquid;
a condensation module, located in the shell, and accommodated therein with a refrigerating material;
a mechanical arm, located in the shell, and configured to move in three-dimensional space;
a buffer bin, located in the shell, disposed above a liquid level of the cooling liquid, and provided with a first bin gate and a second bin gate on the opposite sides of the buffer bin, wherein the first bin gate is located on an outer surface of the shell; the second bin gate is located in the shell; and the buffer bin is provided therein with a conveyance module;
a control module, located outside the shell, and electrically connected to the mechanical arm and the buffer bin, wherein the control module comprises an image display module, the control module is used for controlling the opening and closing of the first and second bin gates of the buffer bin, the control module is further used for controlling a conveying direction of the conveyance module.

9. The device according to claim 8, wherein:
the refrigerating material is used for cooling the cooling liquid having absorbed heat and been gasified.

10. The device according to claim 8, wherein:
the first bin gate and the second bin gate are not opened synchronously.

11. The device according to claim 8, wherein:
the conveyance module is configured to convey a heating element in the buffer bin in two directions.

12. The device according to claim 8, wherein the conveyance module comprises any one of the following:
a conveyor belt and a tray.

13. The device according to claim 8, wherein the buffer bin further comprises:
a recycling module, for recycling the cooling liquid in the buffer bin.

14. The device according to claim 8, further comprising:
an image acquisition module, electrically connected to the control module, and used for acquiring image information in the shell.

15. The device according to claim 8, wherein the image display module is used for displaying an image information.

* * * * *